(12) United States Patent
Corrales

(10) Patent No.: US 7,728,219 B2
(45) Date of Patent: Jun. 1, 2010

(54) PHOTOVOLTAIC CELLS, MODULES AND METHODS OF MAKING SAME

(75) Inventor: Eugenia M. Corrales, Los Altos, CA (US)

(73) Assignee: Sunmodular, Inc., Mountain View, CA (US)

( * ) Notice: Subject to any disclaimer, the term of this patent is extended or adjusted under 35 U.S.C. 154(b) by 539 days.

(21) Appl. No.: 11/788,573

(22) Filed: Apr. 20, 2007

(65) Prior Publication Data

US 2008/0135086 A1    Jun. 12, 2008

Related U.S. Application Data

(60) Provisional application No. 60/874,313, filed on Dec. 11, 2006.

(51) Int. Cl.
*H01L 31/052* (2006.01)
(52) U.S. Cl. ..................................................... 136/246
(58) Field of Classification Search .......... 136/243–265
See application file for complete search history.

(56) References Cited

U.S. PATENT DOCUMENTS

| | | | |
|---|---|---|---|
| 2,989,575 A | 6/1961 | Wallace, Jr. |
| 3,268,366 A | 8/1966 | Guyot |
| 3,833,425 A | 9/1974 | Leinkram et al. |
| 3,976,508 A | 8/1976 | Mlavsky |
| 3,985,116 A | 10/1976 | Kapany |
| 3,999,283 A | 12/1976 | Dean et al. |
| 4,026,267 A | 5/1977 | Coleman |
| 4,056,405 A | 11/1977 | Varadi |
| 4,062,698 A | 12/1977 | Blakeslee et al. |

(Continued)

FOREIGN PATENT DOCUMENTS

JP    2002246629 A  *  8/2002

(Continued)

OTHER PUBLICATIONS

Chokeman, Y. at al. (2005, e-pub. Mar. 9, 2005). "Effect of Fin Pattern on the Air-Side Performance of Herringbone Wavy Fine-and-Tube Heat Exchangers," *Heat Mass Transfer* 41:642-650.

(Continued)

*Primary Examiner*—Jessica L Ward
*Assistant Examiner*—Kevin E Yoon
(74) *Attorney, Agent, or Firm*—The Mueller Law Office, P.C.

(57) ABSTRACT

A photovoltaic cell has electrodes, p- and n-junctions, and a heat sink. The heat sink is on a side of the cell opposite to the light-receiving side of the photovoltaic cell. The photovoltaic cell may also have heat-conducting channels within an interior of the photovoltaic cell that conduct heat from the interior of the photovoltaic cell to the heat sink. The heat sink can remove heat caused by light absorbed by the photovoltaic cell but not converted to electricity as well as heat generated by resistance to high current passing through electrodes of the photovoltaic cell. A module formed of such cells can exhibit greater energy conversion efficiency as a result of the ability to dissipate the heat. A method of making a solar cell or module involves e.g. laminating a heat sink to a photovoltaic cell as described above.

14 Claims, 7 Drawing Sheets

U.S. PATENT DOCUMENTS

| | | | |
|---|---|---|---|
| 4,095,997 | A | 6/1978 | Griffiths |
| 4,106,952 | A | 8/1978 | Kravitz |
| 4,118,249 | A | 10/1978 | Graven et al. |
| 4,131,485 | A | 12/1978 | Meinel et al. |
| 4,149,903 | A | 4/1979 | Lindmayer |
| 4,180,414 | A | 12/1979 | Diamond et al. |
| 4,186,033 | A * | 1/1980 | Boling et al. ............... 136/247 |
| 4,193,081 | A | 3/1980 | Kaplow et al. |
| 4,200,472 | A | 4/1980 | Chappell et al. |
| 4,209,347 | A | 6/1980 | Klein |
| 4,296,741 | A | 10/1981 | Harder |
| 4,326,012 | A | 4/1982 | Charlton |
| 4,336,413 | A | 6/1982 | Tourneux |
| 4,352,948 | A | 10/1982 | Kaplow et al. |
| 4,361,717 | A | 11/1982 | Gilmore et al. |
| 4,389,533 | A | 6/1983 | Ames |
| 4,392,007 | A | 7/1983 | Barkats et al. |
| 4,571,448 | A | 2/1986 | Barnett |
| 4,582,953 | A | 4/1986 | Nagase et al. |
| 4,587,376 | A * | 5/1986 | Kosaka et al. ............... 136/248 |
| 4,595,789 | A | 6/1986 | Nagase et al. |
| 4,710,588 | A | 12/1987 | Ellion |
| 4,830,678 | A * | 5/1989 | Todorof et al. .............. 136/259 |
| 5,118,361 | A | 6/1992 | Fraas et al. |
| 5,125,983 | A | 6/1992 | Cummings |
| 5,232,518 | A | 8/1993 | Nath et al. |
| 5,255,666 | A | 10/1993 | Curchod |
| 5,437,735 | A | 8/1995 | Younan et al. |
| 5,498,297 | A | 3/1996 | O'Neill et al. |
| 5,575,861 | A | 11/1996 | Younan et al. |
| 5,702,558 | A | 12/1997 | Schadel |
| 5,746,839 | A | 5/1998 | Dinwoodie |
| 5,968,287 | A | 10/1999 | Nath |
| 5,986,203 | A | 11/1999 | Hanoka et al. |
| 6,005,184 | A | 12/1999 | Barnes |
| 6,020,554 | A | 2/2000 | Kaminar et al. |
| 6,248,949 | B1 | 6/2001 | Turner |
| 6,274,402 | B1 | 8/2001 | Verlinden et al. |
| 6,294,725 | B1 | 9/2001 | Hirschberg et al. |
| 6,337,283 | B1 | 1/2002 | Verlinden et al. |
| 6,359,209 | B1 | 3/2002 | Glenn et al. |
| 6,387,726 | B1 | 5/2002 | Verlinden et al. |
| 6,399,874 | B1 | 6/2002 | Olah |
| 6,423,568 | B1 | 7/2002 | Verlinden et al. |
| 6,531,653 | B1 | 3/2003 | Glenn et al. |
| 6,553,729 | B1 | 4/2003 | Nath et al. |
| 6,875,914 | B2 | 4/2005 | Guha et al. |
| RE38,988 | E | 2/2006 | Dinwoodie |
| 7,019,971 | B2 | 3/2006 | Houle et al. |
| 7,076,965 | B2 | 7/2006 | Lasich et al. |
| 7,135,350 | B1 | 11/2006 | Smith et al. |
| 2004/0103680 | A1 | 6/2004 | Lasich |
| 2004/0187909 | A1 | 9/2004 | Sato et al. |
| 2004/0221886 | A1 | 11/2004 | Oono |
| 2005/0022857 | A1 | 2/2005 | Daroczi et al. |
| 2005/0022861 | A1 | 2/2005 | Rose et al. |
| 2005/0061360 | A1 | 3/2005 | Horioka et al. |
| 2005/0068725 | A1 | 3/2005 | Houle et al. |
| 2005/0076948 | A1 | 4/2005 | Komamine |
| 2005/0077615 | A1 | 4/2005 | Yu et al. |
| 2005/0081909 | A1 | 4/2005 | Paull |
| 2006/0032527 | A1 | 2/2006 | Stevens et al. |
| 2006/0042682 | A1 | 3/2006 | Wolfe et al. |
| 2006/0137733 | A1 | 6/2006 | Schripsema et al. |
| 2006/0196535 | A1 | 9/2006 | Swanson et al. |
| 2007/0199590 | A1 | 8/2007 | Tanaka et al. |
| 2008/0006320 | A1 | 1/2008 | Magnussen et al. |
| 2008/0023061 | A1 | 1/2008 | Clemens et al. |
| 2008/0134497 | A1 | 6/2008 | Corrales et al. |
| 2008/0135085 | A1 | 6/2008 | Corrales et al. |
| 2008/0135088 | A1 | 6/2008 | Corrales |
| 2008/0135090 | A1 | 6/2008 | Corrales |
| 2008/0135092 | A1 | 6/2008 | Corrales |
| 2008/0135094 | A1 | 6/2008 | Corrales |

FOREIGN PATENT DOCUMENTS

| | | |
|---|---|---|
| WO | WO-79/00140 A1 | 3/1979 |
| WO | WO-93/14525 A1 | 7/1993 |
| WO | WO-00/05769 A1 | 2/2000 |
| WO | WO-00/30184 A1 | 5/2000 |
| WO | WO-00/57486 A1 | 9/2000 |
| WO | WO-02/056389 A1 | 7/2002 |
| WO | WO-03/098705 A1 | 11/2003 |
| WO | WO-2005/045328 A1 | 5/2005 |
| WO | WO-2005/100715 A1 | 10/2005 |

OTHER PUBLICATIONS

Non-Final Office Action mailed on Jul. 21, 2009, for U.S. Appl. No. 11/788,456, filed Apr. 19, 2007, 17 pages.
Non-Final Office Action mailed on Jul. 23, 2009, for U.S. Appl. No. 11/804,657, filed May 18, 2007, 15 pages.
Non-Final Office Action mailed on Aug. 5, 2009, for U.S. Appl. No. 11/788,703, filed Apr. 19, 2007, 11 pages.
Non-Final Office Action mailed on Aug. 5, 2009, for U.S. Appl. No. 11/804,399, filed May 18, 2007, 10 pages.
U.S. Appl. No. 11/788,456, filed Apr. 19, 2007, by Corrales et al.
U.S. Appl. No. 11/788,703, filed Apr. 19, 2007, by Corrales et al.
U.S. Appl. No. 11/804,399, filed May 18, 2007, by Corrales.
U.S. Appl. No. 11/804,656, filed May 18, 2007, by Corrales.
U.S. Appl. No. 11/804,657, filed May 18, 2007, by Corrales.
U.S. Appl. No. 11/804,695, filed May 18, 2007, by Corrales.

* cited by examiner

PHOTOVOLTAIC CELLS, MODULES AND METHODS OF MAKING SAME

CROSS REFERENCE TO RELATED APPLICATIONS

This application claims the benefit of priority to U.S. Application Ser. No. 60/874,313, entitled "Modular Solar Roof Tiles And Solar Panels With Heat Exchange" filed Dec. 11, 2006, which is incorporated by reference in its entirety herein as if it was put forth in full below.

BACKGROUND

The invention relates to silicon photovoltaic cells such as solar cells and improvements in solar energy conversion efficiency.

There is renewed interest in providing electricity from solar energy due to high energy costs and a forecast that the cost of energy will remain high for a prolonged period of time. While efficiency of photovoltaic cells has been improved over the past decade, additional improvements are essential to further the widespread adoption of photovoltaic generation of electricity by businesses as well as by home-owners.

Thus, a goal of the invention is to provide improved photovoltaic cells and modules that have the potential to provide improved efficiency of conversion of incident light to electricity. The invention also provides methods of making photovoltaic cells.

BRIEF SUMMARY

The invention provides, inter alia, photovoltaic cells, modules, and methods of making the same.

A photovoltaic cell may have (1) a heat sink or other heat exchanger on a side of the cell that is not exposed to the light source and (2) one or more heat-conducting channels within the cell that absorb heat from surrounding material of the cell and conduct the heat to the heat sink or heat exchanger. The photovoltaic cell may be formed of single crystal silicon, polysilicon, or amorphous silicon, for instance.

In one instance, a photovoltaic cell has electrodes on the back side of the cell (i.e. on the side opposite of the light-receiving side of the cell), near the p- and n-junctions of the cell. The photovoltaic cell also has a heat sink affixed to the back side of the cell. In this construction, heat generated by light absorption as well as heat generated by current flowing through electrodes of cells (particularly cells connected in series and therefore carrying high levels of current through relatively thin electrical layers deposited by e.g. sputtering the metal onto a substrate during manufacturing) can be dissipated, keeping conversion efficiency high for a given temperature of operation and therefore providing the potential for a higher level of power than might otherwise be attained.

In another instance, a module has multiple photovoltaic cells as discussed above and at least one heat sink affixed to cells of the module. The heat sink(s) may span multiple cells and may extend the length or width of the module if desired. The heat sink(s) may dissipate heat generated by high current flowing through cells connected in series and therefore maintain the cells of the module at a lower operating temperature, thereby improving energy conversion efficiency of and power provided by the module.

A method of making a photovoltaic cell includes providing heat-conducting channels formed of a material having a higher thermal conductivity than surrounding material of the photocell to a surface of the photocell opposite to the light-receiving surface, and providing a heat exchanger such as a heat sink in thermal communication with the heat-conducting channels so that the heat exchanger may either dissipate heat from the cell or provide heat to the cell to improve cell efficiency and therefore increase electrical power generated by the cell.

Further, a method of making a photovoltaic cell involves forming p-type regions, n-type regions, and electrodes at a surface of a cell that is opposite to the light-receiving surface of the cell, and also attaching a heat sink at the surface opposite to the light-receiving surface. The heat sink may be adhered using an adhesive, or the heat sink may be attached by e.g. a solder layer on the heat sink or by laminating the heat sink to the cell using an intermediate polymer layer. The method may include incorporating heat-conducting channels within the photovoltaic cell, which channels are in thermal communication with the heat sink.

These and other devices and methods are disclosed herein.

DETAILED DESCRIPTION OF ONE OR MORE PREFERRED EMBODIMENTS

A photovoltaic ("PV") cell may be formed of amorphous silicon, polycrystalline silicon, single-crystal silicon, III-V semiconductors or other semiconductors or electroceramics, for instance. Such PV cells may therefore have a p-i-n structure, a p-n junction, or a heterojunction. Cells may have incorporated into them heat-conducting channels that aid in transferring heat into or out of the bulk material around the heat-conducting channels.

Figure 1:
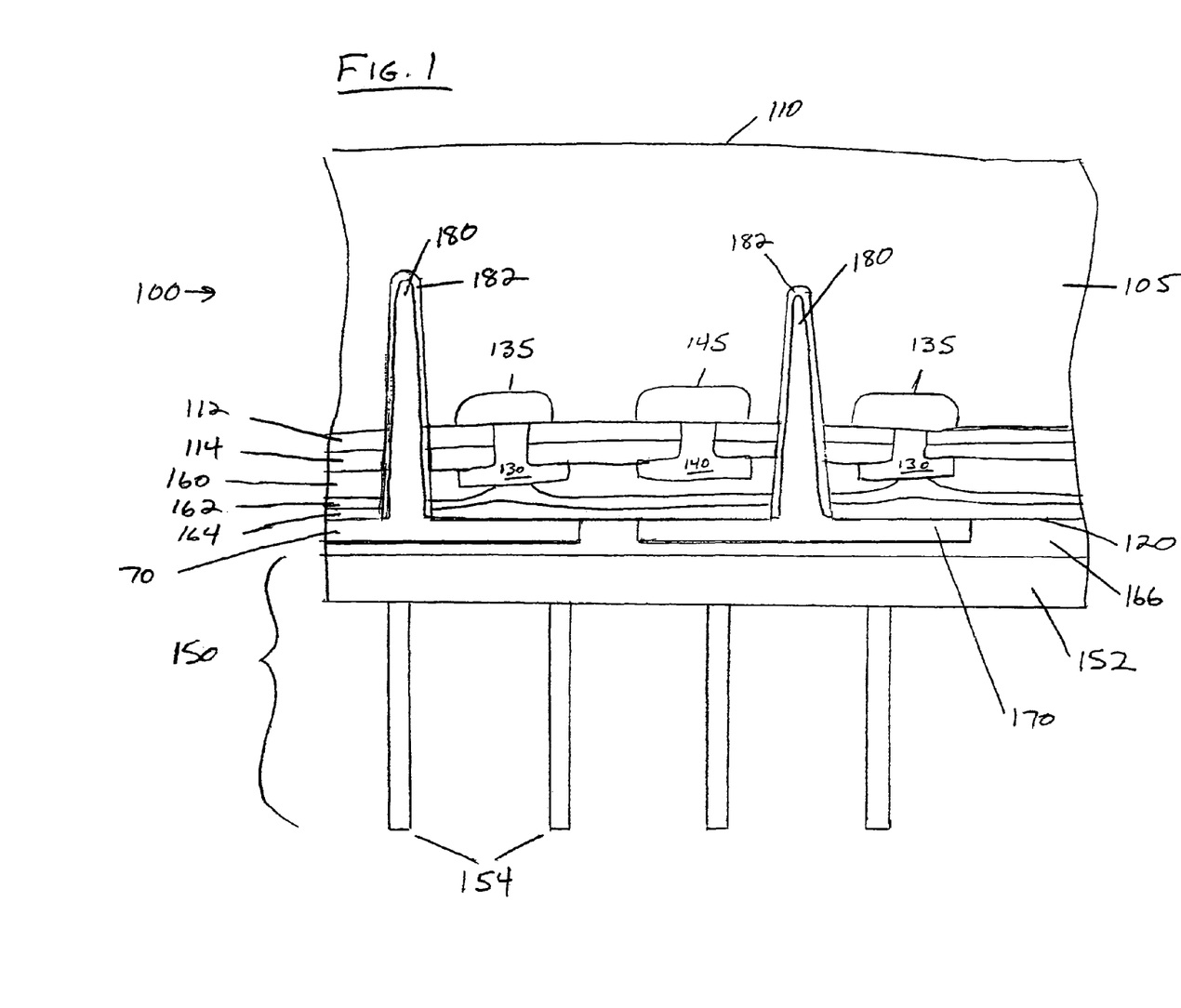
FIG. 1 illustrates a photovoltaic cell and heat sink.

A portion of a PV cell 100 is depicted in FIG. 1 as one example of a PV cell formed from single-crystal silicon. The photovoltaic cell 100 is formed from e.g. an n-type silicon wafer 105 and has a light-receiving surface 110 and a surface 120 opposite the light-receiving surface. Cell 100 has multiple pairs of p-n regions formed at the same surface 120 and that generate electricity in response to light irradiating the light-receiving surface 110.

Cell 100 as illustrated in FIG. 1 has a first electrode 130 connected to a p-junction 135 and a second electrode 140 connected to an n-junction 145 of the photovoltaic cell. The first and second electrodes are also positioned at the surface 120 that is opposite the light-receiving surface. The electrodes are separated from silicon wafer 105 by silicon dioxide passivating layer 112 and silicon nitride passivating layer 114.

A heat sink 150 resides at surface 120 of the cell depicted in FIG. 1, and an electrically insulating layer 160, electrically conducting layer 162, and electrically insulating layer 164 are interposed between heat sink 150 and first electrode 130 and second electrode 140.

The heat sink illustrated in FIG. 1 has base portion 152 and multiple fins 154. In this instance, the heat sink is secured to platforms 170 via e.g. a polymer layer 166, and the heat sink spans multiple pairs of p-n junctions. Platforms 170 are, in turn, connected to heat-conductive channels 180 formed within photovoltaic cell 100.

Heat-conductive channels 180 within photovoltaic cell 100 have a thin electrical insulator layer 182 and rapidly conduct heat from the photovoltaic cell to platforms 170, where heat is distributed over a larger area and transfers into heat sink 150 for dissipation through base portion 152 and fins 154.

During operation, a photovoltaic cell absorbs a substantial amount of light that is not utilized to promote electrons to the conduction band. The absorbed light is converted to heat as phonons within the silicon lattice of the photovoltaic cell, and the cell temperature increases as a result. Energy conversion efficiency may decrease as the temperature of the PV cell increases, and therefore the power produced by the cell decreases as the cell warms throughout the day.

The energy conversion efficiency of the cell at different temperatures may be calculated by maintaining the PV cell at the desired temperature and measuring power output and by using the following equation: $\eta=(P_m/(E \times A_c))$, where $P_m$ is maximum electrical power in watts, E is the input light irradiance in W/m$^2$ (1000 W/m$^2$ and spectrum AM 1.5 g) and $A_c$ is the surface area of the solar cell in m$^2$. A PV cell may exhibit approximately a 20% decrease or more in energy conversion efficiency from morning to noon due to temperature change.

Photovoltaic cell 100 can be maintained at a lower temperature than a comparative photovoltaic cell otherwise identical to photovoltaic cell 100 but lacking the heat conductive channels, platforms, and heat sink. Because of its lower temperature, photovoltaic cell 100 has higher efficiency than its comparative photovoltaic cell, and therefore photovoltaic cell 100 provides more power than its comparative cell provides at the same temperature.

For other types of PV cells, such as those made of amorphous silicon, the amount of power output over time may increase if the PV cells are maintained at a higher temperature. In these instances, the heat sink may be in thermal communication with a fluid that is hotter than the PV cell in order to heat the cell to improve its power output over time.

Figure 5:
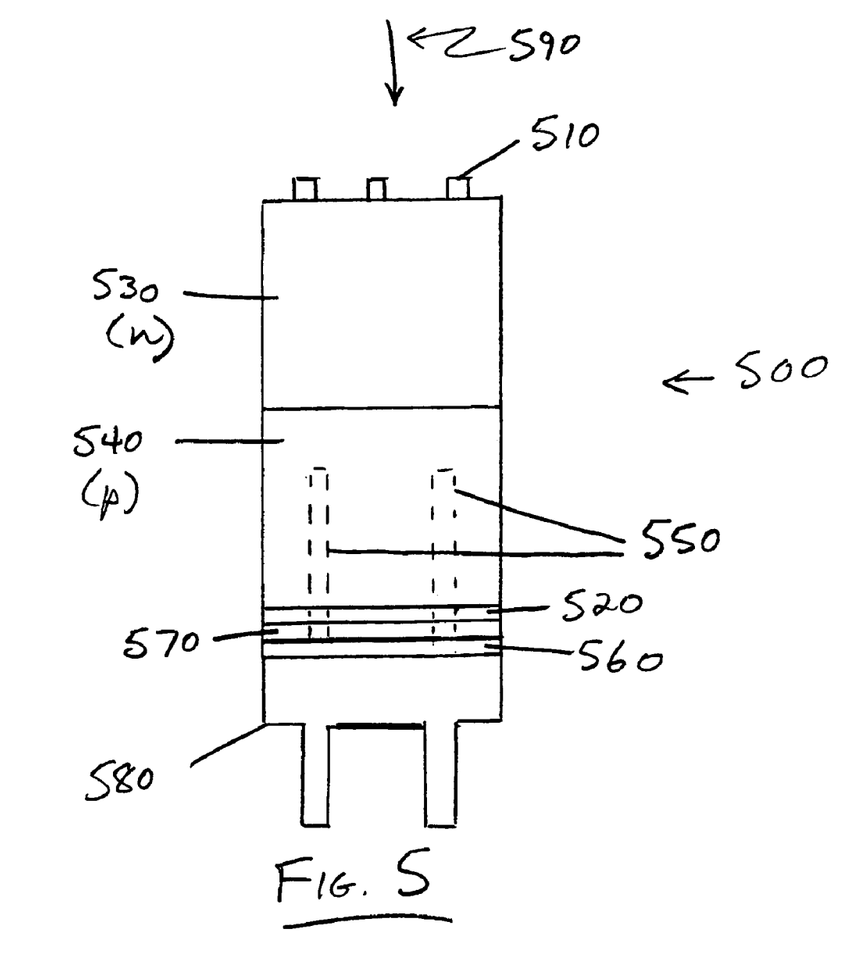
FIG. 5 is a photovoltaic cell having a p-n junction and having heat-conducting channels and heat exchanger.

FIG. 5 illustrates a p-n junction PV cell 500 in which electrodes 510 and 520 are at opposite faces of the cell. Electrode 510 is in electrical contact with n-type semiconductor material 530 that receives light depicted by arrow 590, and electrode 520 is in electrical contact with p-type semiconductor material 540. Heat-conducting channels 550 are formed of e.g. aluminum and are insulated from the p-type semiconductor and electrode 520 by e.g. a silicon dioxide layer that was deposited or grown (if the semiconductor material is silicon). Thermally conductive platform 560 (e.g. aluminum, copper, thermally conductive polymer) is electrically insulated from electrode 520 by electrically insulating layer 570 (e.g. silicon dioxide, silicon nitride, polyimide or other electrically insulating polymer). FIG. 5 depicts a heat exchanger such as heat sink 580 attached to platform 560, which is positioned at a side of the PV cell opposite of the light-receiving side of PV cell. The heat sink may reside solely upon the cell as shown or may extend to other PV cells in the array of PV cells incorporated into a module.

Figure 6A:
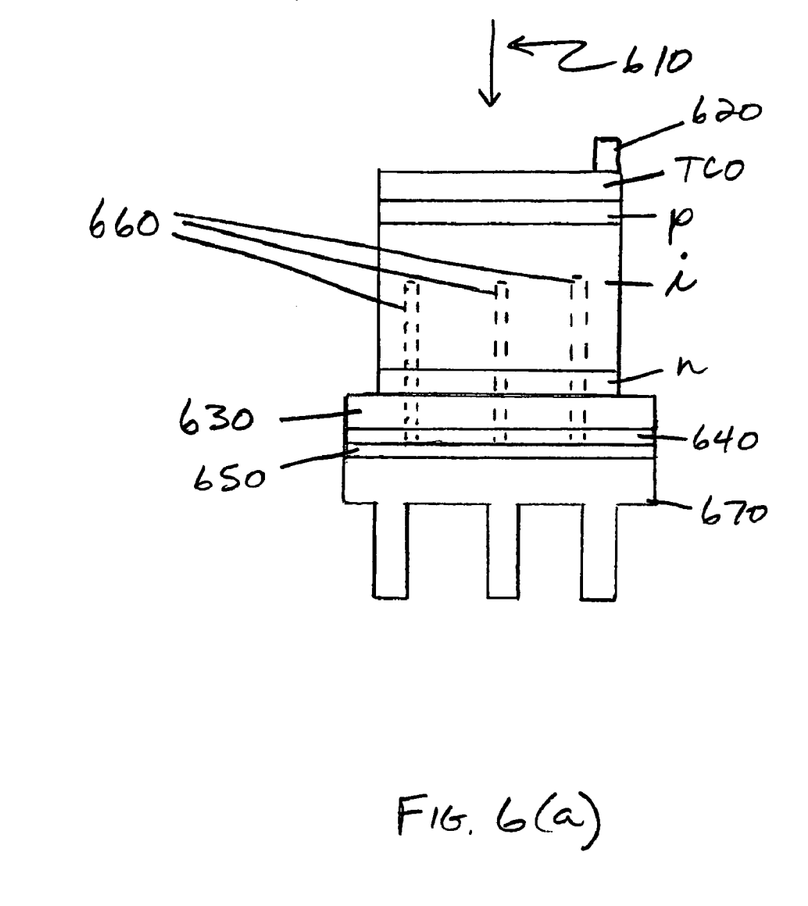
FIGS. 6(a) and 6(b) illustrate two p-i-n type photovoltaic cells having heat-conducting channels and heat exchangers.
Figure 6B:
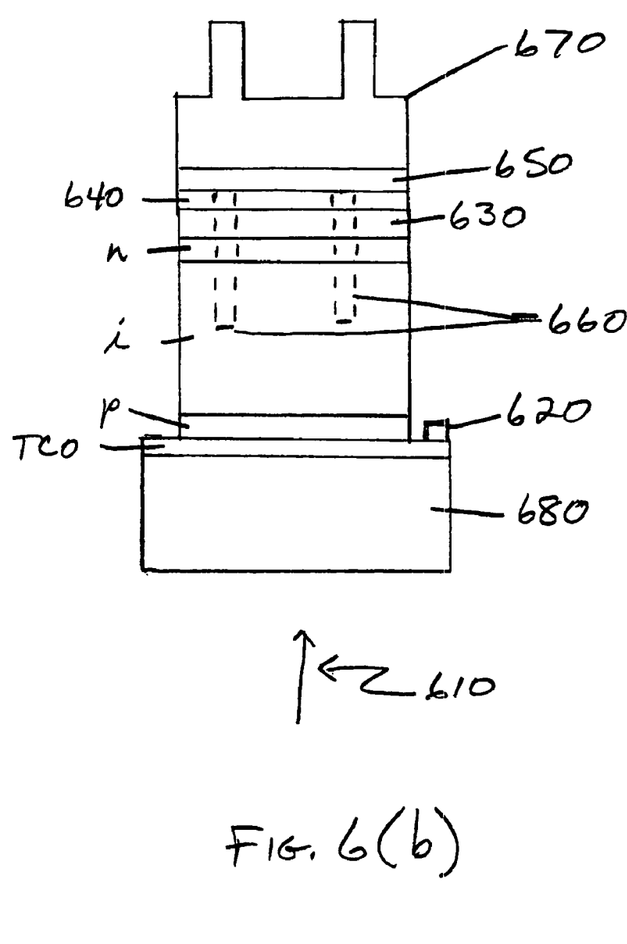

FIG. 6(a) and FIG. 6(b) illustrate two types of p-i-n PV cells. In the cell of FIG. 6(a), light depicted by arrow 610 passes through transparent, electrically conductive oxide (TCO) layer and p-layer to insulating (i) layer, in which holes and electrons are created. Electrode 620 is in electrical contact with the p-layer, and electrode 630 is in electrical contact with the n-layer. Electrically insulating layer 640 insulates thermally conductive platform 650 from electrode 630. Platform 650 is in thermal communication with heat-conducting channels 660 formed of e.g. a metal such as aluminum or copper, and the heat-conducting channels are electrically insulated from surrounding or bulk material such as i-layer and n-layer as well as electrode 630 and insulating layer 640. Thermally conducting platform 650 is also in thermal communication with heat exchanger 670, in this instance a heat sink.

Elements in FIG. 6(b) have reference numbers identical to reference numbers for similar elements in FIG. 6(a). Referring to FIG. 6(b), light depicted by arrow 610 passes through transparent substrate 680 (e.g. glass), through transparent, electrically conductive oxide (TCO) layer and p-layer to insulating (i) layer, in which holes and electrons are created. Electrode 620 is in electrical contact with the p-layer through TCO layer, and electrode 630 is in electrical contact with the n-layer. Electrically insulating layer 640 insulates thermally conductive platform 650 from electrode 630. Platform 650 is in thermal communication with heat-conducting channels 660 formed of e.g. a metal such as aluminum or copper or heat-conductive polymer, and the heat-conducting channels are electrically insulated by e.g. a layer of oxide from surrounding or bulk material such as i-layer and n-layer as well as electrode 630 and insulating layer 640. Thermally conducting platform 650 is also in thermal communication with heat exchanger 670, in this instance a heat sink.

Figure 2A:
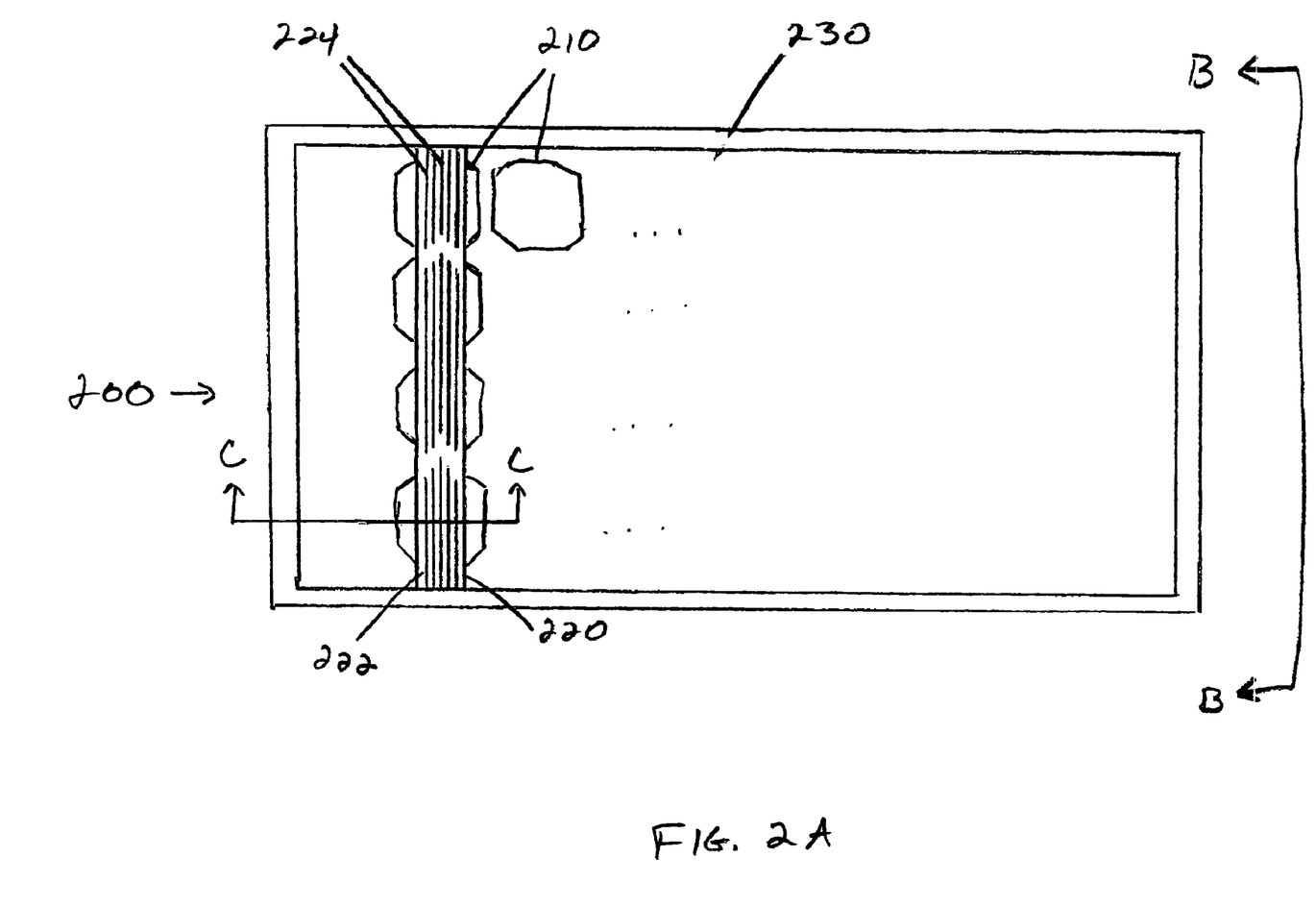
FIG. 2A depicts a module of photovoltaic cells in an array and a heat sink across a row of the cells.
Figure 2B:
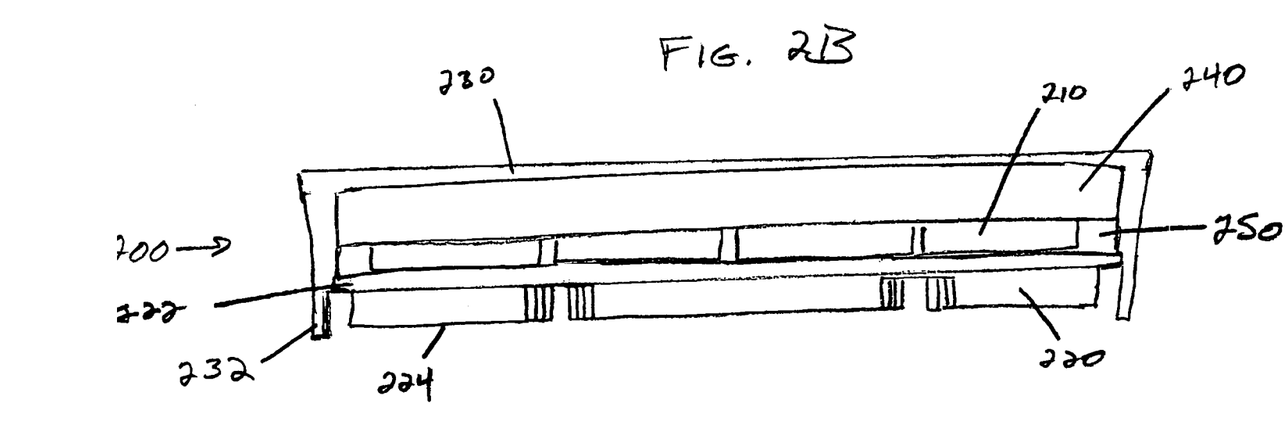
FIG. 2B is a view of the module of FIG. 2A along the line B-B.
Figure 2C:
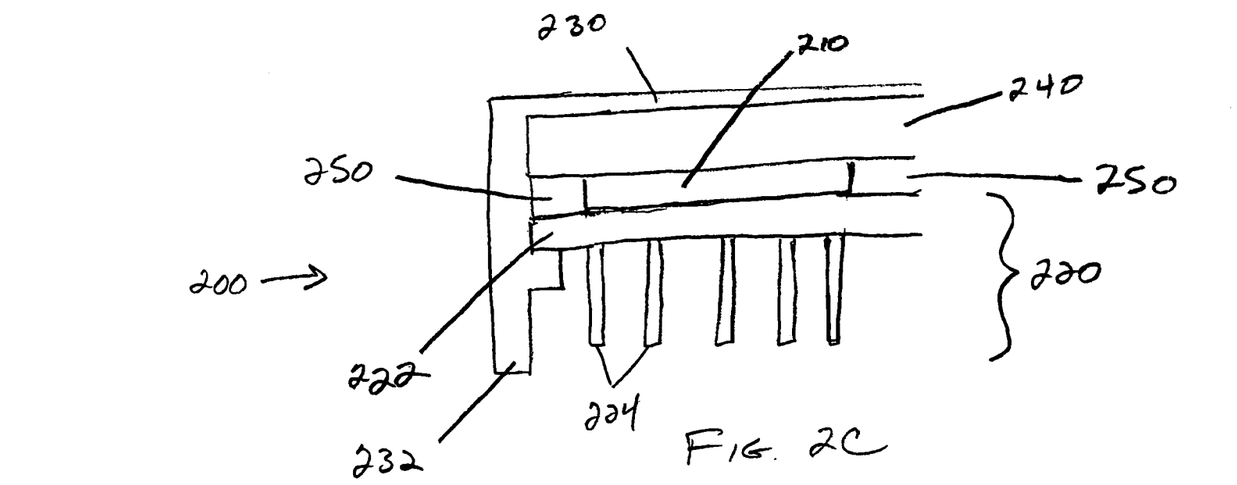
FIG. 2C is a view of the module of FIG. 2A along the line C-C.

FIGS. 2A, 2B, and 2C depict different views of a module 200 that can be formed using any of the photovoltaic cells discussed above. A module typically comprises an array of photovoltaic cells in which rows and/or columns of cells are electrically interconnected in a serial configuration. A module may contain at least 15 or 16 PV cells arranged in three or more rows as explained below, and often modules are supplied with 36 or 72 PV cells incorporated into them. In the depiction in FIG. 2A (a bottom view of the module), an array of PV cells 210 as discussed previously is secured in a frame 230, and a heat sink 220 is secured to platforms of multiple PV cells. Each of the PV cells in the array has heat conductive channels and platforms as discussed previously. In this instance, a single heat sink 220 can span the entire width (as depicted in FIGS. 2A, 2B, and 2C) or length of the module, if desired, on the side of the module that is opposite to the light-receiving side.

Module 200 may have a glass layer 240 residing above the light-receiving surfaces of PV cells. The cells may be attached to a grid 250 within frame 230, and one or more polymer layers or films may be laid down upon the back surfaces of the PV cells and optionally upon the base portion 222 of the heat sink to encapsulate and further protect the PV cells from a harsh ambient environment during use as well as to adhere base portion 222 to platforms of the PV cells and/or other surfaces of the back side of the PV cells.

A solar module may have a frame with mounting fixtures such as screw holes, tabs, and/or electrical connections that are suitable to mount the module in framework that is attached to a finished roof-top so that heat from the solar cells may be dissipated into ambient air. It is preferable for roof-top mounting that little or none of the frame of the module blocks the channels between fins so that relatively cool air may flow freely through the channels and past cooling fins. FIGS. 2B and 2C illustrate how the fins and channels therebetween are free of the frame so that air may travel through the channels unimpeded by the frame. Legs 232 permit the module to be set upon a flat surface during handling and prior to installation. Legs 232 may also be used to mount the module to a surface such as a rooftop. Legs may be sufficiently long that they elevate the module a sufficient distance from the surface to which they are mounted that air flows freely beneath and through channels through and past the fins to provide improved energy conversion efficiency over a similar construction in which the fins touch the surface.

The framework into which modules may be inserted typically has footers especially adapted to mount to common roofing materials such as composite roofing or wood battens forming part of the roof structure. Often, the framework has a height such that fins of the module's heat sink just touch or are just above the surface (e.g. rooftop) on which the framework is mounted. Alternatively, the framework may elevate the module over the rooftop a sufficient distance that air may flow sufficiently freely beneath and through the channels between fins to provide improved efficiency over a similar construction in which the fins touch the rooftop.

Modules typically contain three to six columns of PV cells with each column containing from five to twelve PV cells each. Modules therefore contain typically 15, 18, 21, 24, 27, 30, 20, 24, 28, 32, 36, 40, 25, 35, 45, 50, 42, 48, 54, 60, 33, 44, 55, 66, or 72 PV cells. A module may, for example, have from five to twelve heat sinks in instances where a single heat sink is in contact with cells across an entire row of PV cells in the module.

Often anywhere from 4 to 20 modules are installed in a solar module on the roof-top of a house, depending on the amount of south-facing (in the northern hemisphere) rooftop is available. Many more solar modules may be installed on the larger roofs of commercial buildings, for instance, or upon land.

The fins 224 and base 222 of the heat sink 220 may be in contact with a gas or a liquid cooling medium. In one instance, the module and its frame do not have a bottom piece that would, if present, form a mostly enclosed area beneath the heat sink. Instead, the heat sink is free to e.g. radiate heat to its surrounding environment without a bottom portion of the module itself impeding heat transfer to a significant extent. In another instance, a module may be mounted in a framework that has a gas- or liquid-filled chamber into which the heat sink extends. This configuration provides an additional large heat sink by virtue of the volume of fluid contained therein, for instance, and additional fins may be mounted on the outside of the fluid chamber to dissipate heat from the fluid (e.g. water) to air. Alternatively or additionally, the fluid may circulate through a further heat exchanger or radiator.

Figure 3:
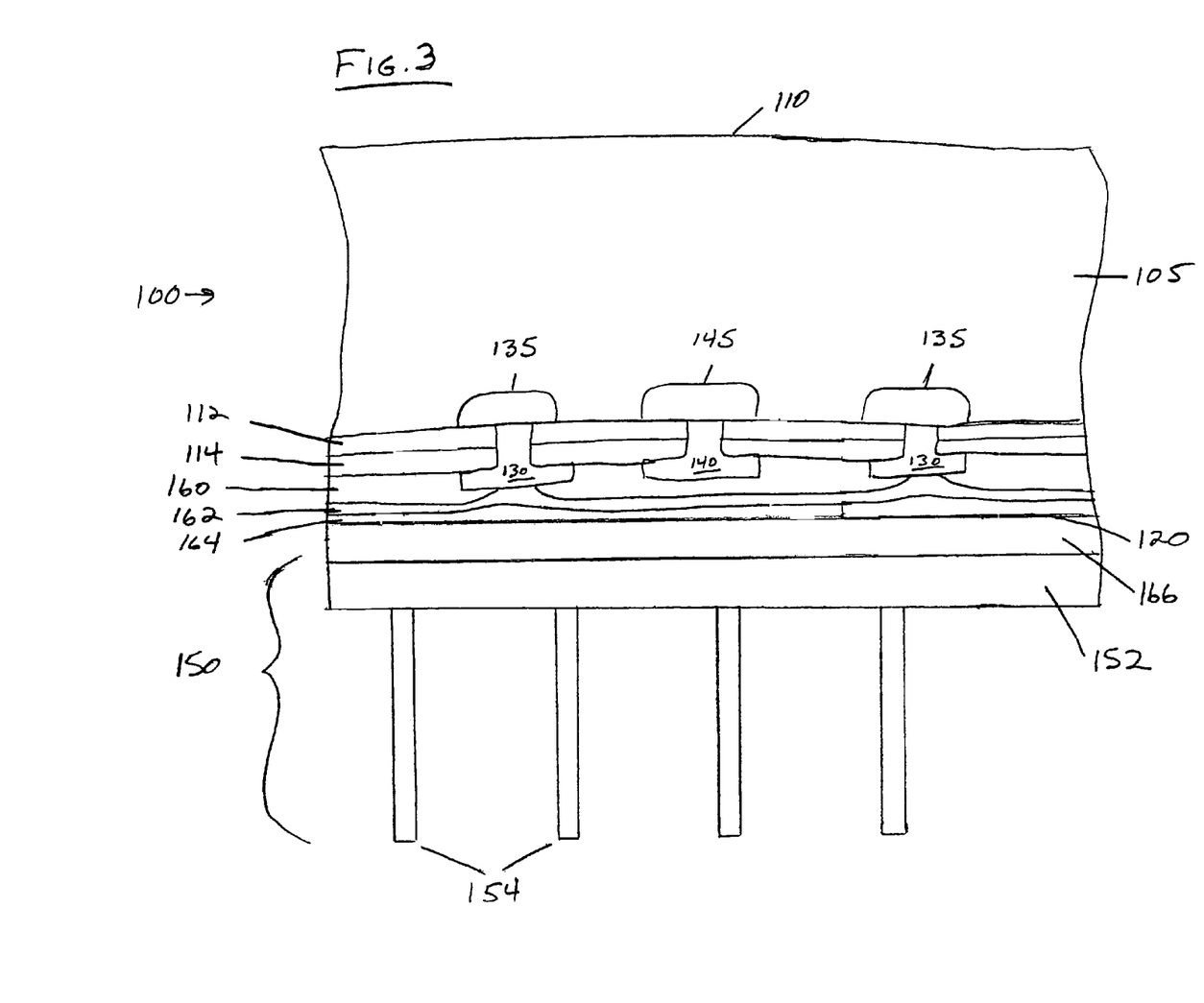
FIG. 3 illustrates another photovoltaic cell.

FIG. 3 illustrates a PV cell that has a heat sink but not the heat conducting channels and platforms of the PV cell of FIG. 1. In FIG. 3, feature numbers are identical for like features depicted in FIG. 1. The heat sink 150 removes heat from the bottom side of the PV cell 100 and dissipates the heat to the medium in contact with the fins 154 and base 150 of the heat sink.

Heat conductive channels, platforms, and heat sink are typically formed of one or more materials having a higher coefficient of thermal conductivity than the surrounding materials of the PV cell. Such materials include heat conductive polymer, metals, and metal alloys such as copper, aluminum, 6063 aluminum alloy, 6061 aluminum alloy, and 6005 aluminum alloy, optionally anodized or plated with e.g. tin. The heat sink may be dark in color (dark gray, blue, brown, black) to aid in heat transfer.

In one instance, a heat sink as disclosed in U.S. Ser. No. [to be assigned] and entitled "Modular Solar Panels with Heat Exchange and Methods of Making Thereof", inventors Eugenia Corrales and Ana Corrales, filed Apr. 19, 2007 and incorporated by reference herein as if put forth in full below, is utilized. In the referenced application, heat sinks having particular dimensions and constructions are disclosed, as are methods of installing the heat sinks on a PV cell array.

As disclosed in that application, a heat sink may span multiple pairs of p-n junctions of a PV cell and a portion of or the entire width of the PV cell. A heat sink may span portions of or the entire width of multiple PV cells.

In one instance, a single heat sink may span the entire width of a module and be attached to all of the PV cells along the path. This configuration simplifies installation and also can improve performance, since a large heat-transfer surface is provided to remove heat from the solar cells of the module.

Figure 4:
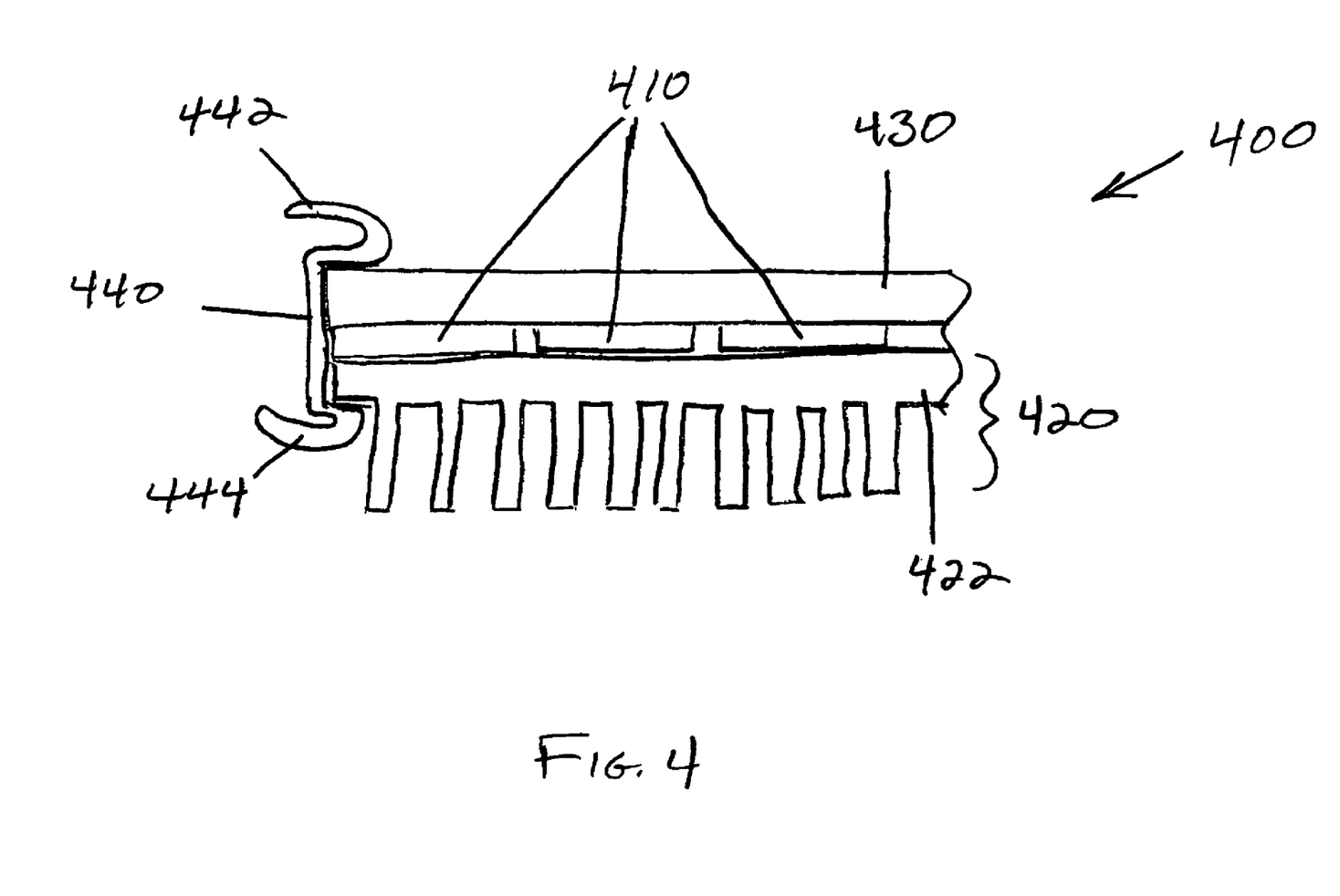
FIG. 4 is a side view of a module containing multiple PV cells and a heat sink.

FIG. 4 illustrates that photovoltaic cells 410 and heat sinks 420 of a module 400 may be secured to other components such as a protective glass cover 430 by a frame 440 around part or all of the periphery of the glass cover. The frame may have a first eared portion 442 that secures the frame to the top surface of glass cover 430 as well as a second eared portion 444 that secures the frame to the bottom surface of the base portion 422 of the heat sink. The eared portions provide greater structural integrity to the frame 440 while keeping weight of the frame to a minimum to help maintain module weight low.

A heat sink may be formed in many different shapes. A heat sink may be finned as discussed above, or a heat sink may have e.g. cone-shaped or frustum cone-shaped projections that aid in dissipating heat. A heat sink may have a rectangular base, or the base may wind along a serpentine path for instance so that the heat sink may contact two rows of PV cells. Heat sinks may be mounted to modules either parallel or perpendicular to the long axis or length of the module, and fins if present may run continuously along most or all of the length of the base. Alternatively, the fins may have gaps along their length to allow hot air to escape and cooler air to enter the channels between fins. FIG. 2A illustrates a heat sink in which fins have gaps that form a chevron-shaped opening, for instance.

The fins of a heat sink may be flat plates or may have other shapes such as scallops or curved planes, for instance. Fins may be approximately parallel or parallel to a long axis of the heat sink, or they may be approximately perpendicular or perpendicular to a long axis of the heat sink. Fins may not all form the same angle with respect to the long axis of the heat sink, since it may be desirable to provide different angles so that air may pass freely through many of the channels formed by adjacent fins irregardless of wind direction if the heat sink is to be cooled by outdoor ambient air.

A heat sink may be a multi-finned heat sink having sufficient heat transfer capacity to remove heat from the silicon and from the electrodes and thereby reduce the temperature of a photovoltaic cell by at least 5° C. at a luminance of 1000 W/m$^2$, spectrum AM 1.5 g, and quiescent air at 25° C. as compared to a comparative photovoltaic cell otherwise identical but lacking the heat sink, heat conducting channels, and platforms. The size, number, and spacing of fins, the size of the base portion, and the materials of construction of the heat sink may be selected based on the desired decrease in temperature over the comparative PV cell. In some instances, the heat sink is configured to reduce the temperature of the PV cell by at least 7° C. or by at least 10° C. over the comparative PV cell.

The heat sink is attached to platforms of a PV cell by e.g. adhering or laminating the heat sink to the platforms. A solder layer may be placed on the platforms and/or heat sink, and platforms and heat sink may be soldered to one another by increasing the temperature of the heat sink and contacting it to the platforms of the PV cell. Alternatively, a thermally-conductive adhesive such as a silicone elastomer available from Dow Chemical (e.g. Dow Corning® 1-4173, 1-4174, 3-1818, 3-6751-53, and DA-6524) may be used to adhere the heat sink to one or more PV cells, or a polymer such as a polyamide, polyolefin such as polyethylene or polypropylene, or a copolymer such as ethylene-vinyl alcohol (EVOH) may be used to laminate the heat sink to the platforms.

A PV cell can be formed by incorporating heat-conducting channels into the interior of the cell and placing a heat exchanger such as a heat sink in thermal communication with the heat-conducting channels. The heat-conducting channels can often be located in areas of cells that do not interfere with essential functions to be performed in adjacent areas. Channels in a PV cell may be formed by e.g. laser-etching, reactive ion etching, or wet-etching a PV cell or at intermediate stages during fabrication of a PV cell, electrically insulating the etched areas by e.g. depositing electrically-insulating material such as silicon nitride or silicon oxide on walls in the channels, and depositing e.g. a thermally conductive polymer or metal such as aluminum or copper by sputtering or molecular beam epitaxy to form PV cells as depicted in FIGS. 1, 5, and 6

Heat-conducting channels may be easily incorporated into p-n and p-i-n PV cells such as those depicted in FIG. 5 and FIG. 6. Because of the location of p-type and n-type junctions and electrodes in the PV cell of FIG. 1, other methods may be adopted to form this type of PV cell.

A PV cell as depicted in FIG. 1 may be formed by a method as disclosed in U.S. Ser. No. 09/475,185 while including the following variations. This patent application or patent issued from this application is incorporated by reference in its entirety as if it was put forth in full below.

In one instance, after depositing the layer of silicon nitride 114 on the native or deposited oxide layer 112 on n-type silicon wafer 105, the method involves masking using a photoresist, patterning using photolithography, and etching to form a portion of deep holes in an n-type silicon wafer (optionally having a profile that tapers from wide to narrow from the surface of the wafer to the interior) using e.g. deep reactive ion etching. Typical etchants include $SF_6$, $C_4F_8$ and/or $O_2$. The deep holes may have a layer of native oxide 182 grown in them after appropriate masking at this point or after patterning and etching layers 112 and 114. Other steps as disclosed in U.S. Pat. No. 6,274,402 are performed to the point that metal fills holes above n- and p-type regions. At this point, metal is also deposited into the deep holes to provide heat-transfer channels 180. This is followed by masking and etching to form electrodes 140 and 130 for n-type regions and p-type junctions respectively as well as to provide interfacial areas for heat exchange platforms to be formed. After forming electrodes contacting n-type regions and p-type regions, the electrically isolating layer 164 (e.g. polyimide or oxide) is patterned and etched to expose interfacial areas for heat exchange platforms to interface with heat-conducting channels 180 or to expose metal deposited above interfacial areas. Metal such as aluminum or copper is deposited and optionally etched to form platforms 170 that aid in dissipating heat from the heat-conducting channels and transferring the heat into base portion 152 of heat sink 150. Heat sink 150 is attached to platforms by e.g. laminating with e.g. polyamide, polyolefin such as polyethylene or polypropylene, or EVOH or layer of other polymer or with adhesive (166).

A photovoltaic cell as illustrated in FIG. 3 may be made similarly by following a method as disclosed in U.S. Ser. No. 09/475,185 and attaching heat sink 150 by e.g. laminating with e.g. polyamide, polyolefin such as polyethylene or polypropylene, or EVOH or layer of other polymer or with adhesive (166) onto electrically isolating layer 164 (e.g. polyimide or oxide).

One variation of the method above includes an additional step prior to depositing electrically isolating layer 164 of e.g. polyimide or oxide the step of depositing a layer of e.g. aluminum or copper and optionally etching to form platforms that aid in transferring heat from the PV cell into base portion 152 of heat sink 150 as well as in adhering the heat sink to the PV cell.

Other methods of making a PV cell, as well as additional PV cells as used herein (and having additional features not explicitly recited herein but disclosed by virtue of the incorporation by reference), are discussed in U.S. application Ser. Nos. 09/475,256, 09/474,760, 09/475,187, 11/328,419, 09/475,185, 09/474,760, 10/632,747, 10/633,188, and 11/210,213, which are each individually incorporated by reference in their entirety herein as if put forth in full below.

In all of the methods above, the methods optionally include an additional step of further coating or encapsulating the bottom of the PV cells (including or not including the base of heat sink 150) with a polymer such as EVOH to help protect the PV cells from the environment.

The invention has been described and specific examples of the invention have been portrayed. While the invention has been described in terms of particular variations and illustrative figures, those of ordinary skill in the art will recognize that the invention is not limited to the variations or figures described. In addition, where methods and steps described above indicate certain events occurring in certain order, those of ordinary skill in the art will recognize that the ordering of certain steps may be modified and that such modifications are in accordance with the variations of the invention. Additionally, certain of the steps may be performed concurrently in a parallel process when possible, as well as performed sequentially as described above. Therefore, to the extent there are variations of the invention which are within the spirit of the disclosure or equivalent to the inventions found in the claims, it is the intent that this patent will cover those variations as well. Finally, all publications and patent applications cited in this specification are herein incorporated by reference in their entirely as if each individual publication or patent application were specifically and individually put forth herein.

The present invention is not to be limited in scope by the examples or specific devices discussed herein, as these are intended as illustrations of certain aspects of the invention. The devices and examples are therefore not to be construed as limiting the scope of the claims to the specific illustrations. Rather, various modifications of the invention in addition to those shown and described herein will become apparent to those skilled in the art from the foregoing description and fall within the scope of the appended claims.

What is claimed is:

1. A photovoltaic cell having
  a) a light-receiving surface and a surface opposite the light-receiving surface,
  b) a semiconductor body comprising a first region, a second region not the same as the first region, and a junction at an interface of the first region and the second region, c) a first electrode electrically connected to the first region and a second electrode electrically connected to the second region of the photovoltaic cell, d) a heat sink at the surface opposite the light-receiving surface, and e) heat-conducting channels in thermal communication with the heat sink and extending into the semiconductor body.

2. A photovoltaic cell according to claim 1 wherein the heat-conducting channels extend into at least one of the first region and the second region.

3. A photovoltaic cell according to claim 1 wherein the semiconductor body further comprises a third region different from the first region and the second region.

4. A photovoltaic cell according to claim 3 wherein the heat-conducting channels extend into the third region.

5. A photovoltaic cell according to claim 4 wherein the heat-conducting channels also extend into at least one of the first and the second regions.

6. A photovoltaic cell according to claim 4 wherein the heat-conducting channels do not extend into the first region, and the heat conducting channels do not extend into the second region.

7. A photovoltaic cell according to claim 5 wherein the first region is a p-type region, the second region is an n-type region, and the third region is an i-type region.

8. A photovoltaic cell according to claim 6 wherein first region is a p-type region, the second region is an n-type region, and the third region is a portion of a silicon substrate from which the cell is formed.

9. A photovoltaic cell according to claim 1 wherein the junction is a heterojunction.

10. A photovoltaic cell according to claim 1 further comprising heat conducting platforms positioned between the heat conducting channels and the heat sink and in thermal communication with the heat conducting channels and the heat sink.

11. A photovoltaic cell according to claim 1 wherein the heat conducting channels have an electrically insulating layer between the heat conducting channels and material of the surrounding body of the photocell.

12. A photovoltaic cell according to claim 1 wherein the heat conducting channels are formed of a metal or an alloy.

13. A photovoltaic cell according to claim 1 wherein the heat sink is formed of a thermally conductive polymer.

14. A photovoltaic cell according to claim 1 wherein the heat conducting channels are formed of a metal or alloy and the heat sink is formed of a thermally conductive polymer.

* * * * *